United States Patent
Maniscalco et al.

(10) Patent No.: US 11,682,471 B2
(45) Date of Patent: Jun. 20, 2023

(54) DUAL DAMASCENE CROSSBAR ARRAY FOR DISABLING A DEFECTIVE RESISTIVE SWITCHING DEVICE IN THE ARRAY

(71) Applicant: International Business Machines Corporation, Armonk, NY (US)

(72) Inventors: Joseph F. Maniscalco, Lake Katrine, NY (US); Oscar van der Straten, Guilderland Center, NY (US); Koichi Motoyama, Clifton Park, NY (US); Choonghyun Lee, Rensselaer, NY (US); Seyoung Kim, Weschester, NY (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 16/885,317

(22) Filed: May 28, 2020

(65) Prior Publication Data
US 2021/0375389 A1   Dec. 2, 2021

(51) Int. Cl.
| | | |
|---|---|---|
| H01L 27/24 | (2006.01) | |
| G11C 29/00 | (2006.01) | |
| G11C 13/00 | (2006.01) | |
| H10B 63/00 | (2023.01) | |
| H10N 70/00 | (2023.01) | |

(52) U.S. Cl.
CPC ........ *G11C 29/886* (2013.01); *G11C 13/0007* (2013.01); *G11C 13/0069* (2013.01); *G11C 13/0097* (2013.01); *H10B 63/80* (2023.02); *H10N 70/066* (2023.02); *H10N 70/826* (2023.02); *H10N 70/841* (2023.02);
(Continued)

(58) Field of Classification Search
CPC ............. H01L 27/2463; H01L 45/1233; H01L 45/1253; H01L 45/16
See application file for complete search history.

(56) References Cited

U.S. PATENT DOCUMENTS

| | | | |
|---|---|---|---|
| 6,034,882 | A | 3/2000 | Johnson et al. |
| 6,418,069 | B2 | 7/2002 | Schamberger et al. |
| (Continued) | | | |

FOREIGN PATENT DOCUMENTS

| | | |
|---|---|---|
| CN | 101145599 A | 3/2008 |
| CN | 101197318 A | 6/2008 |
| (Continued) | | |

OTHER PUBLICATIONS

International Search Report and Written Opinion for Application No. PCT/CN2021/091158 dated Jul. 30, 2021, 10 pages.

*Primary Examiner* — Mark V Prenty
(74) *Attorney, Agent, or Firm* — Cantor Colburn LLP; Daniel Yeates

(57) ABSTRACT

Provided are embodiments for method of fabricating a dual damascene crossbar array. The method includes forming a bottom electrode layer on a substrate and forming a first memory device on the bottom electrode layer. The method also includes forming a dual damascene structure on the first memory device, wherein the dual damascene structure includes a top electrode layer and a first via, wherein the first via is formed between the first memory device and the top electrode layer. Also provided are embodiments for the dual damascene crossbar and embodiments for disabling memory devices of the dual damascene crossbar array.

14 Claims, 9 Drawing Sheets

(52) U.S. Cl.
CPC .. *G11C 2013/0078* (2013.01); *G11C 2213/15* (2013.01); *G11C 2213/52* (2013.01)

(56) References Cited

U.S. PATENT DOCUMENTS

| | | | |
|---|---|---|---|
| 7,212,454 | B2 | 5/2007 | Kleveland et al. |
| 7,545,667 | B2 | 6/2009 | Elmegreen et al. |
| 7,684,265 | B2 | 3/2010 | Bankman et al. |
| 7,709,928 | B2 | 5/2010 | Kim et al. |
| 7,770,067 | B2 | 8/2010 | Lockwood et al. |
| 8,630,108 | B2 | 1/2014 | Li |
| 9,355,746 | B2 | 5/2016 | Alves et al. |
| 11,309,492 | B2 * | 4/2022 | Trinh ................. H01L 27/2481 |
| 2010/0232240 | A1 | 9/2010 | Norman |
| 2011/0155992 | A1 | 6/2011 | Kao et al. |
| 2012/0218807 | A1 | 8/2012 | Johnson |
| 2019/0259943 | A1 | 8/2019 | Ando et al. |
| 2020/0161236 | A1 | 5/2020 | Kim et al. |

FOREIGN PATENT DOCUMENTS

| | | | |
|---|---|---|---|
| CN | 101908374 | A | 12/2010 |
| CN | 109545957 | A | 3/2019 |

* cited by examiner

DUAL DAMASCENE CROSSBAR ARRAY FOR DISABLING A DEFECTIVE RESISTIVE SWITCHING DEVICE IN THE ARRAY

BACKGROUND

The present invention generally relates to fabrication methods and resulting structures for semiconductor devices. More specifically, the present invention relates to a dual damascene crossbar array structure configured and arranged to disable a defective resistive switching device in the array.

Resistive random access memory (RRAM) is a nano-scale non-volatile memory (NVM). RRAM provides simple storage cell components, high density, low power, large endurance, fast write, read and erase speeds, and excellent scalability. A typical RRAM storage cell is a two-terminal device formed as a metal-insulator-metal (MIM) structure, which is also known as a resistive switching device (RSD) or a cross-point device. The insulator material can be a binary metal oxide, which makes the MIM/RSD storage cell compatible with silicon-based CMOS (complementary metal-oxide semiconductor) fabrication process. When a sufficient electrical signal is applied across the metal electrodes of a MIM/RSD, the resistance of the insulator can be switched from one resistance state to another. The insulator retains its current resistance state until an appropriate electrical signal is applied across the metal electrodes to change it.

RRAM, along with the logic circuitry used to address, read and write individual RRAM cells, can be implemented in an array (e.g., a RRAM cell array), which is compatible with a variety of electronic circuits and devices, including neuromorphic architectures. Multiple pre-neurons and post-neurons can be connected through the array of RRAMs, which naturally expresses a fully-connected neural network.

SUMMARY

Embodiments of the present invention are directed to a method for fabricating a dual damascene crossbar array. A non-limiting example of the method includes forming a bottom electrode layer on a substrate, forming a first memory device on the bottom electrode layer, and forming a dual damascene structure on the first memory device, wherein the dual damascene structure includes a top electrode layer and a first via, wherein the first via is formed between the first memory device and the top electrode layer.

Embodiments of the present invention are directed to a dual damascene crossbar array includes one or more memory devices of the dual damascene crossbar array, a bottom electrode coupled to the one or more memory devices, one or more vias coupled to each memory device, and a top electrode layer coupled to the one or more vias, the one or more vias are positioned between the memory device and the top electrode layer.

Embodiments of the present invention are directed to a method of disabling memory devices of a dual damascene crossbar array. The method includes identifying a faulty memory device of the dual damascene crossbar array, where the crossbar array includes one or more memory devices of the dual damascene crossbar array, a bottom electrode coupled to the one or more memory devices, one or more vias coupled to each memory device, and a top electrode layer coupled to the one or more vias, the one or more vias are positioned between the memory device and the top electrode layer. The method also includes disabling the faulty memory device of the dual damascene crossbar array, and operating remaining one or more memory devices of the dual damascene crossbar array.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 3-6 depict views of a section of a substrate/wafer after various fabrication operations on a semiconductor structure to form a crossbar array according to embodiments of the invention, in which:

FIG. 3 depicts a cross-sectional view of the semiconductor structures after fabrication operations according to embodiments of the invention;

FIG. 4 depicts a cross-sectional view of the semiconductor structures after fabrication operations according to embodiments of the invention;

FIG. 5 depicts a cross-sectional view of the semiconductor structure after fabrication operations according to embodiments of the invention; and FIG. 6 depicts a cross-sectional view of the semiconductor structure after fabrication operations according to embodiments of the invention;

Figure 1B:
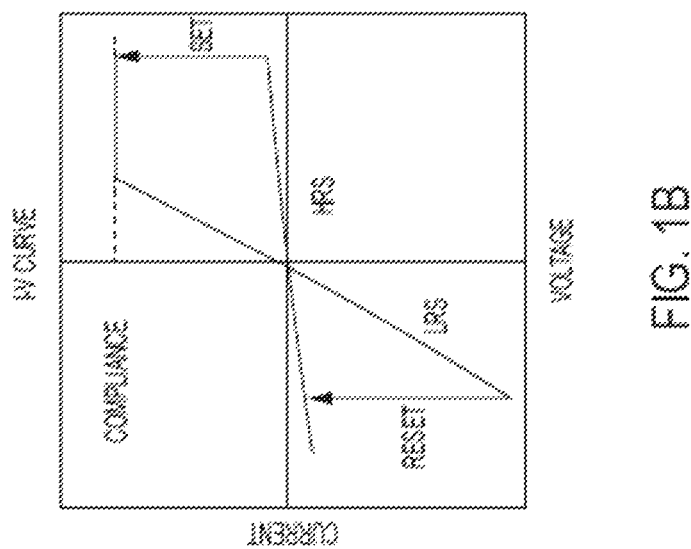
FIG. 1B depicts a diagram of an I-V curve illustrating the switching operation of the RSD component shown in FIG. 1A.

The diagrams depicted herein are illustrative. There can be many variations to the diagrams or the operations described therein without departing from the spirit of the invention. For instance, the actions can be performed in a differing order or actions can be added, deleted or modified. Also, the term "coupled", and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in RRAM crossbar arrays, the typical device failure modes are devices that cannot be formed and devices that are over-formed causing short circuits in the crossbar array. In the case of unformed failures, the problem is less severe because the corresponding cross-point device does not contribute to the computing of the crossbar array. However, in the case of over-forming, the resistance values of the failed cross-point devices are significantly lower than the remaining cross-point devices that are connected in the same row and column. The cross-point devices of the row and column of the crossbar array become effectively unusable due to the severe current draw from the failed (over-formed) cross-point device.

Issues can arise from the above-described high current draw including power supplies that can meet or exceed their limits and potentially become damaged. High current amplifies the parasitic wire resistance effect and the voltage drop at the other cross-point devices connected in the same row/column can vary widely in the crossbar array. In addition, current reading circuitry can become damaged or reach its limits and therefore, the computation can fail.

Turning now to an overview of the aspects of the invention, one or more embodiments of the invention address the above-described shortcomings of the prior art by providing a crossbar array configured and arranged to disable specific defective devices within a RRAM dual damascene crossbar array by leveraging the electromigration properties caused by increased current while maintaining the stable operation of the rest of the array. In general, ICs include a network of conductors and interconnect structures that couple signals to and from the various logic circuits and memory of the IC. Electromigration occurs in conductors and interconnect structure due to the momentum transfer of electrons that are traveling in the medium. Over time, the electrons can cause damage to the conductor and negatively impact the performance of the conductor. This can lead to poor reliability and unpredictably in the performance of the circuit. As the size of the structures of ICs decreases, electromigration becomes a more critical factor. Embodiments of the invention leverage the electromigration properties of conductors and interconnect structures to disable a defective cross-point device in the crossbar array. In embodiments of the invention, a high current can be passed through a cross-point device of a crossbar array to form a void in a connection caused by electro-migration. The void disables the device in the array while allowing the remaining devices in the crossbar array to remain operable. The above-described aspects of the invention address the shortcomings of the prior art by enabling a crossbar array structure to disable defective devices of the array by inducing voids in the channels coupled to the devices.

Figure 1A:
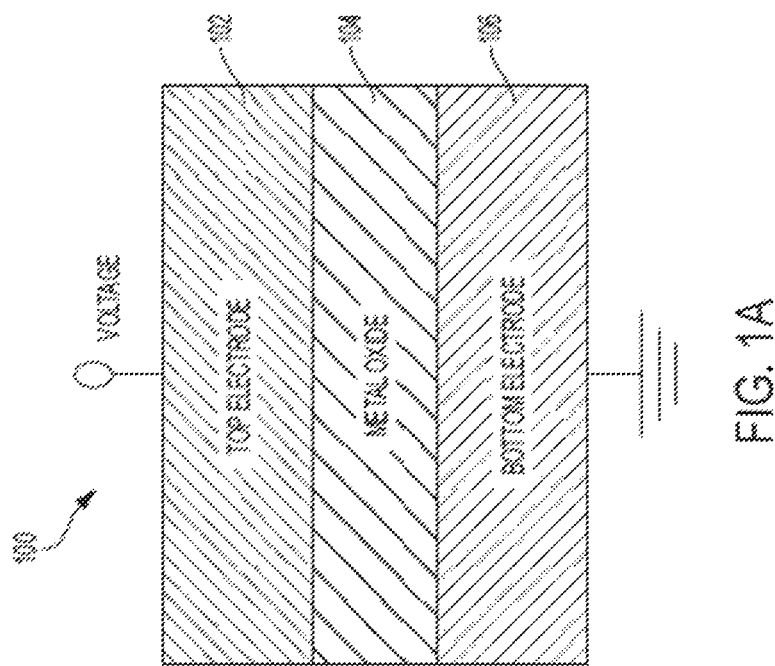
FIG. 1A depicts a simplified block diagram illustrating a cross-sectional view of a two-terminal resistive switching device (RSD), which can be used as a storage cell of an RRAM structure capable of incorporating aspects of the invention.

Turning now to a more detailed description of aspects of the present invention, FIG. 1A depicts a simplified block diagram illustrating a cross-sectional view of a two-terminal RSD component, which can be used as a storage cell of an RRAM structure (e.g., crossbar array 200 shown in FIG. 2) capable of incorporating aspects of the invention. The RSD storage cell 100 includes a top electrode 102, metal oxide 104 active region, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is canceled, which indicates the nonvolatile nature of RRAM. For an initial write operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process and the RESET processes, the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). In both cases, the current is limited by a compliance level during the abrupt set transition in order to suitably control the size of the current conducting filament (CF) and the corresponding LRS resistance value.

Figure 2:
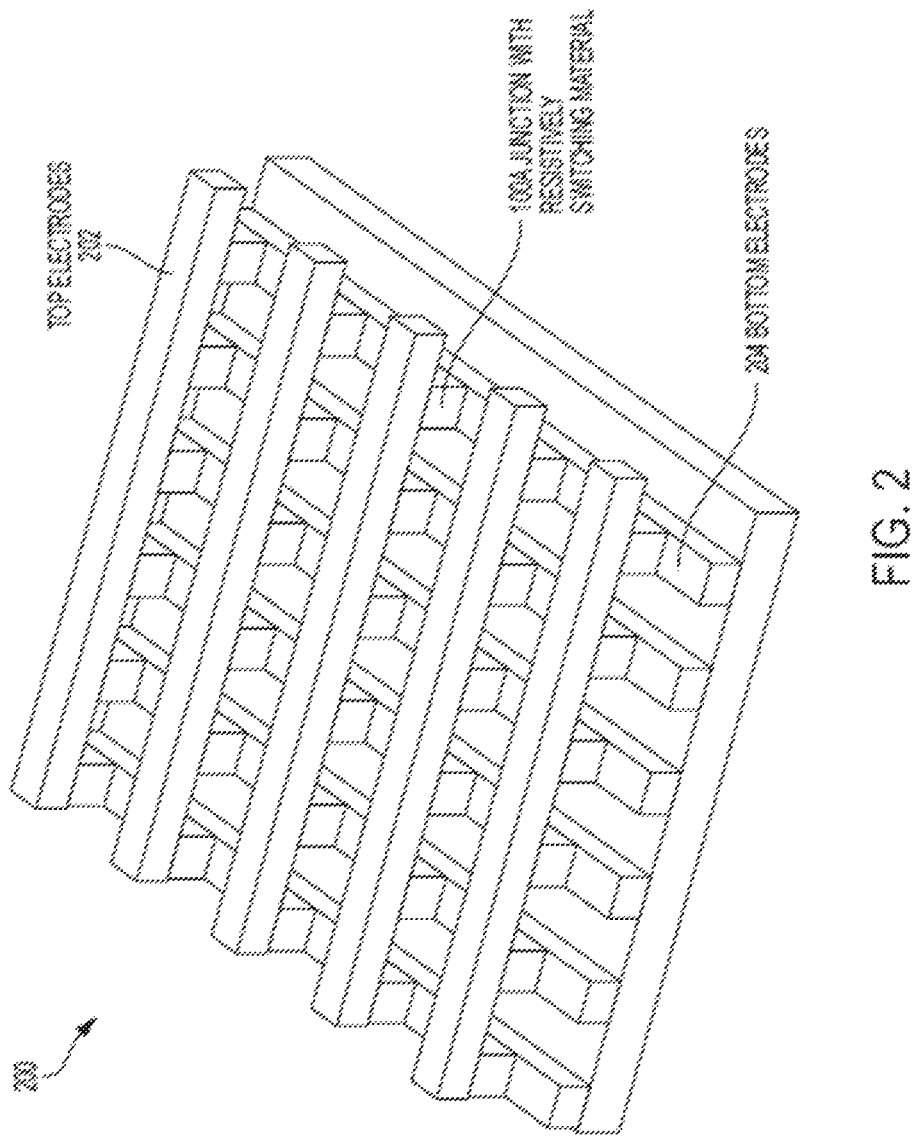
FIG. 2 depicts a simplified block diagram illustrating how the RSD component shown in FIG. 1A can be utilized as an addressable RRAM cell of an RRAM crossbar array capable of incorporating aspects of the invention.

FIG. 2 depicts a simplified block diagram illustrating how the RSD storage cell 100 shown in FIG. 1A can be utilized as an addressable cross point storage cell 100A of an RRAM crossbar array 200 capable of incorporating aspects of the invention. The array 200 includes perpendicular conductive top electrode lines 202 (e.g., wordline rows), conductive bottom electrode lines 204 (e.g., bitline columns), and RSD memory cells 100A at the intersection between each top electrode line 202 and bottom electrode line 204. In embodiments of the invention, the storage cell 100A can be configured to operate the same as the storage cell 100 shown in FIG. 1A. Each storage cell 100A can be accessed for read and write by biasing the corresponding top electrode line 202 and bottom electrode line 204.

Figure 4:
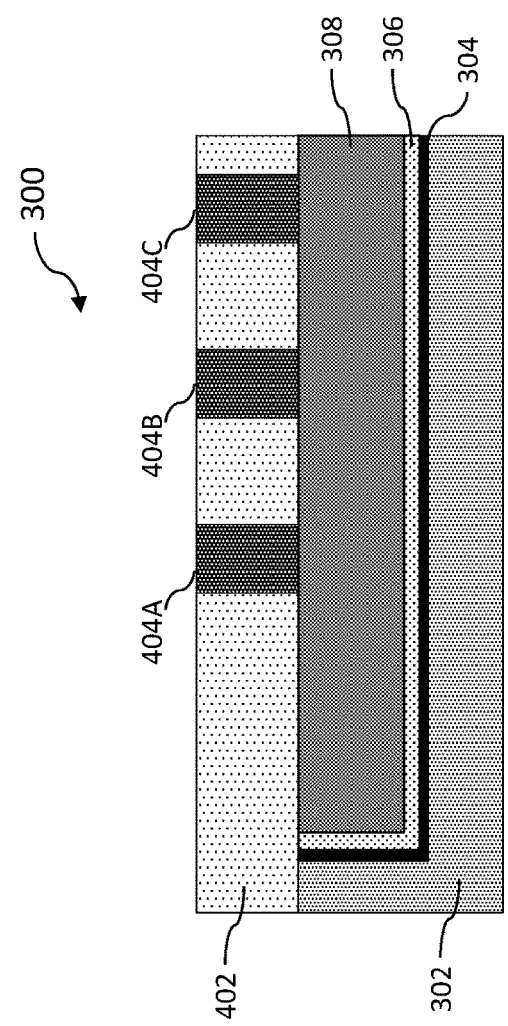
Figure 5:
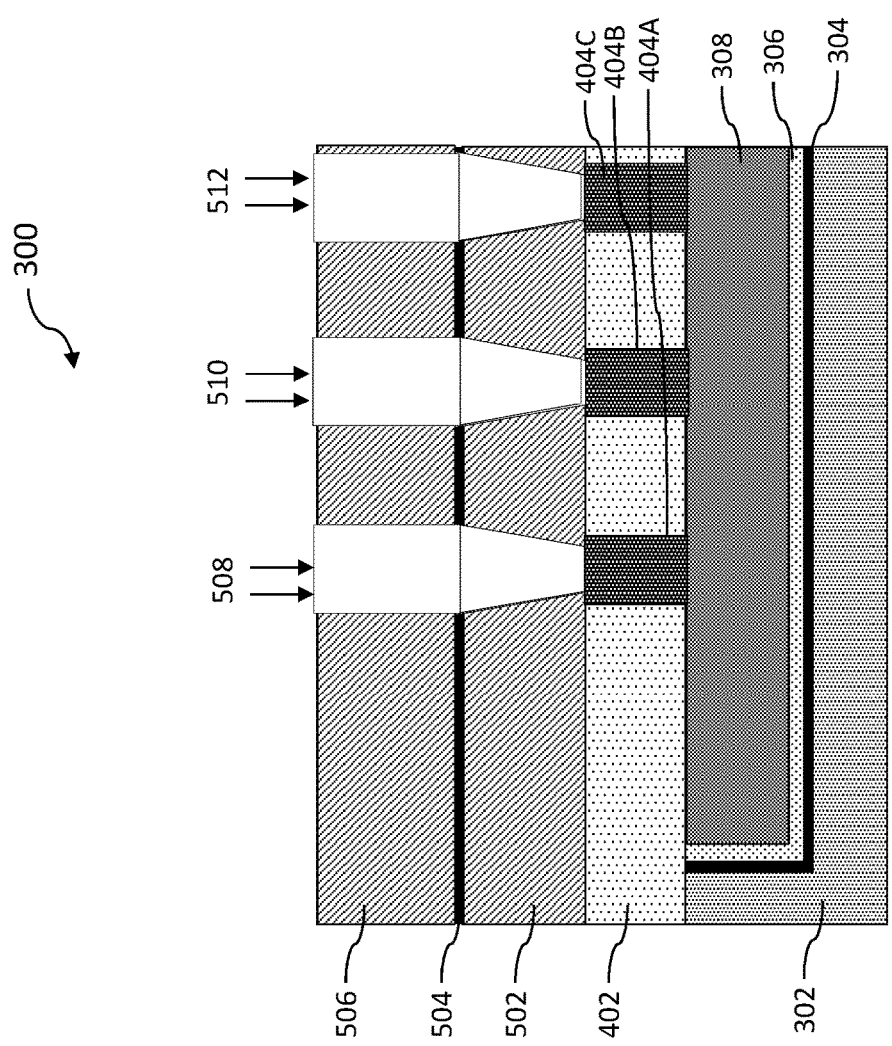
Figure 6:
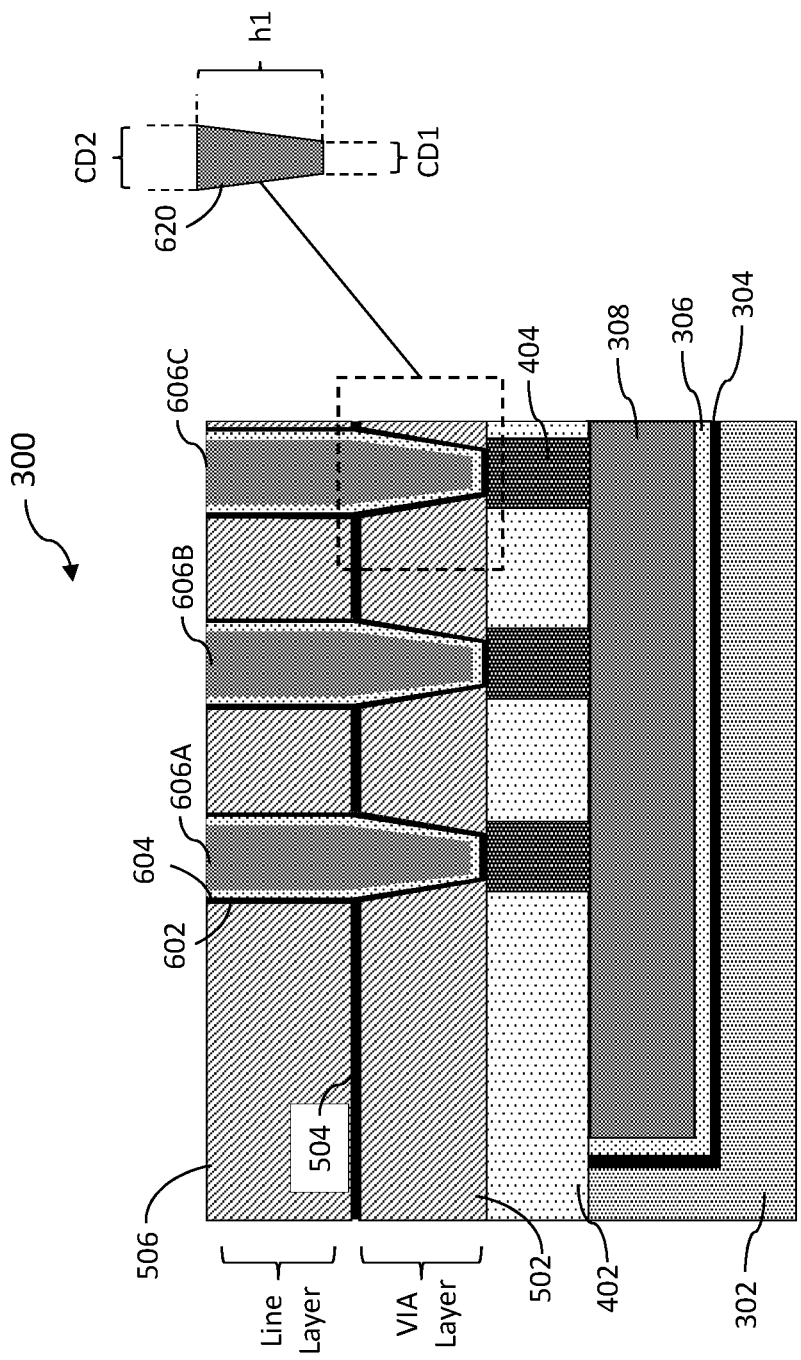

FIGS. 3-6 depict various cross-sectional views of a dual damascene crossbar array structure 300 after various fabrication operations in accordance with one or more embodiments of the invention. The final crossbar array structure 300 shown in FIG. 6 provides a more detailed implementation of the crossbar array 200 shown in FIG. 2, where the bottom electrode lines 204 correspond to the bottom electrodes 308, the top electrode lines 202 correspond to the top electrodes 606A, 606B, 606C, and the RSD memory cells 100A correspond to the memory devices 404A, 404B, 404C.

Figure 3:
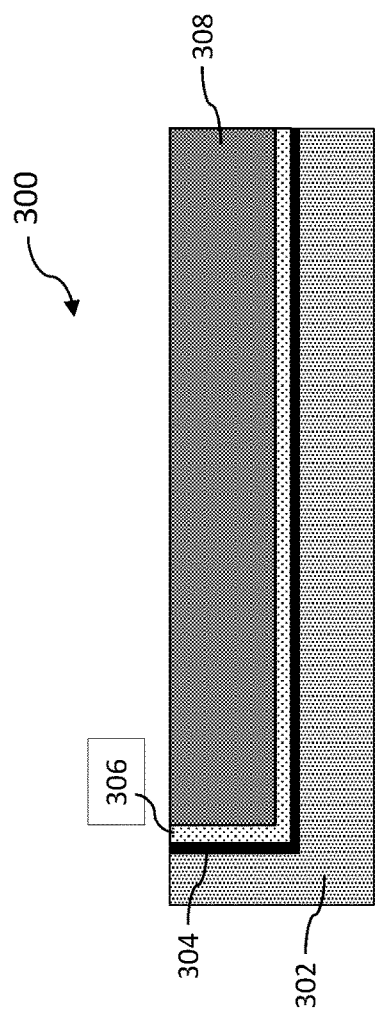

FIG. 3 depicts a cross-sectional view of the structure 300 after an initial set of fabrication operations according to embodiments of the invention. The structure 300 includes a substrate 302. The substrate 302 can be any suitable substrate material, such as, for example, monocrystalline Si, SiGe, SiC, III-V compound semiconductor, II-VI compound semiconductor, or semiconductor-on-insulator (SOI).

In one or more embodiments of the invention, the substrate 302 is formed by depositing and planarizing a layer of substrate material (not shown). A hard mask (not shown) is deposited on the substrate material, patterned, and etched to form the substrate 302 having the structure shown in FIG. 3. A barrier layer 304 has been deposited (e.g., using ALD) on exposed portions of the substrate 302. The barrier layer 304 can include any suitable barrier type material, such as, for example, tantalum nitride (TaN), and can be used to prevent the metal fill material (e.g., 308) from diffusing into other layers of the structure 300.

Referring still to FIG. 3, a liner 306 has been formed on the barrier layer 304. The liner 306 has been conformally deposited (e.g., by atomic layer deposition (ALD)). In some embodiments of the invention, the liner 306 is conformally formed to a thickness of about 1 nm to about 7 nm, although other thicknesses are within the contemplated scope of the invention. In one or more embodiments of the invention, the liner 306 can include material, such as, but not limited to ruthenium (Ru), cobalt (Co), tantalum (Ta), tungsten (W), or titanium (Ti). The liner 306 can serve to aid in forming the metal layer for the bottom electrode layer 308. For example, the liner 306 can facilitate the formation of the bottom electrode copper layer having a low critical dimension.

Referring still to FIG. 3, a bottom electrode layer 308 has been deposited over the liner 306. In one or more embodiments of the invention, the bottom electrode layer 308 includes but is not limited to copper (Cu). In one or more embodiments of the invention, the bottom electrode layer 308 can serve as an interconnection layer to connect devices of different layers (not shown). A chemical mechanical planarization (CMP) has been used to planarize a top surface of the structure 300.

FIG. 4 depicts the structure 300 after performing one or more processes in accordance with one or more embodiments of the invention. In one or more embodiments of the invention, an insulator layer 402 has been deposited over the structure 300. The insulator layer 402 has been patterned (not shown) and etched to form trenches in the insulator layer 402 for the memory devices 404A, 404B, 404C. In this non-limiting example, three (3) memory devices 404A, 404B, 404C have been formed and are shown in FIG. 4, although more or less than three (3) memory devices 404A, 404B, 404C can be provided.

FIG. 5 depicts the structure 300 after performing additional fabrication operations forming a dielectric layer 502, and etch stop layer 504, a dielectric layer 506, and dual damascene trenches 508, 510, 512. In embodiments of the invention, the dielectric layer 502 is formed by depositing and planarizing the dielectric layer 502 over the structure 300. The dielectric layer 502 can include any suitable dielectric material not limited to silicon dioxide $SiO_2$.

In one or more embodiments of the invention, the layer 504 is deposited over the dielectric layer 502. The layer 504 provides more control in creating the desired dimensions for the vias during the etch process. In one or more embodiments of the invention, the layer 504 is an etch-stop layer and, in a non-limiting example, can be silicon nitride (SiN).

In one or more embodiments of the invention, the layer 506 is formed over the layer 504. The top electrode layers of the crossbar array will be formed in the dielectric layer 506, and the dual damascene trenches 508, 510, 512 are formed in the dielectric layers 502 and 506 by an etching process such as a RIE. As shown, the trenches 508, 510, 512, are dual damascene in that the upper region of each of the trenches 508, 510, 512 has substantially parallel sidewalls and is formed in the dielectric layer 506, and the lower region of each of the trenches 508, 510, 512 has tapered (or angled) sidewalls and is formed in the dielectric layer 502. The tapered/angled sidewalls can be formed as a result of a change to the etch process after the upper region of each of the trenches 508, 510, 512 are formed. In accordance with aspects of the invention, the lower regions of the dual damascene trenches 508, 510, 512 are via regions in that the vias 620 (shown in FIG. 6) will be formed therein. In accordance with aspects of the invention, the upper regions of the dual damascene trenches 508, 510, 512 are line (or top electrode) trench regions in that the line layers of the top electrodes 606A, 606B, 606C (shown in FIG. 6) will be formed therein.

FIG. 5 illustrates the shape of the trenches 404A, 404B, 404C for the vias 620 (vias 620 are shown in FIG. 6) are tapered which is a result of the etching process. The dimensions of the vias 620 (e.g., the height, width) are such that an increased current can cause a void to be induced in the vias 620 due to electromigration. In addition, the dimensions of the line portion of the top electrode 606A, 606B, 606C (e.g., height, width) that lies above the vias 620 encourages the void to be formed in the via region and not in the top electrode 606A, 606B, 606C or line portion of the top electrode 606A, 606B, 606C. The current that is provided through the memory devices 404A, 404B, 404C can be in the range of a few milliamps to a few hundred milliamps or a few amps. The current that is provided must be sufficiently above the normal operating current range or threshold so that the electromigration process can open a" void in the selected via 620 of the memory devices, 404A, 404B, 404C.

FIG. 6 depicts the structure 300 after performing one or more processes in accordance with one or more embodiments of the invention. A barrier layer 602 is deposited in the dual damascene trenches 508, 510, 512 formed in FIG. 5. The barrier layer 602 is a diffusion barrier similar to the barrier layer 304. In one or more embodiments, the layer 602 is conformally deposited on the sidewalls of the trenches 508, 510, 512. As shown in FIG. 6, a liner 604 has been deposited on the barrier layer 602. A metal, such as copper, is deposited in each of the trenches 508, 510, 512 to form the line layers of the top electrodes 606A, 606B, 606C, (corresponding to top electrode line 202) and the vias 620 for each of the corresponding memory devices 404A, 404B, 404C, where the memory devices 404A, 404B, 404C correspond to junctions 100A of FIG. 2.

In one or more embodiments of the invention, a dual damascene process is performed to form the line portion of the top electrodes 606A, 606B, 606C and the vias 620 that are below the line portion of the top electrodes 606A, 606B, 606C. The dual damascene process forms two features, such as the line of the top electrode 606A, 606B, 606C and the via 620, simultaneously. For example, the trenches 508, 510, 512 for the via layer and the line of the top electrode 606A, 606B, 606C are filled at once in the same metal deposition process. A CMP can be performed to remove the overburden of the deposited metal.

The dimensions of the vias 620 are required to be smaller than the dimensions of the line portion of the top electrodes 606A, 606B, 606C. This allows the vias 620 to form voids quickly when high current is passed through the selected memory device 404A, 404B, 404C and allows the memory device 404A, 404B, 404C of the crossbar array to be disabled. Therefore, the underlying memory device 404A, 404B, 404C will no longer contribute to the function of the crossbar array.

In a non-limiting example, the height of the via 620 is 1.25 to 2 times the critical dimension (CD) of the via. In a non-limiting example, the interconnect or line portion of the top electrode has a CD of 18 nm and the via portion has a CD that is approximately 12-14 nm. As shown in FIG. 6, the vias 620 formed in the trenches 508, 510, 512 have tapered sidewalls. This can increase the chances that a void can be formed in the via 620 to disable the faulty device in the crossbar array. The narrower dimensions of the via 620 allows for the void to be formed by electromigration in that region due to the increased current.

As shown in FIG. 6, the critical dimensions CD1 of the bottom portion of the via 620 is smaller than the critical dimensions CD2 of the top portion of the via 620. The tapered sidewall angle of the via 620 results in significantly smaller bottom via CD1 than the top via CD2, for example, CD1=10 nm and CD2=14 nm. In one or more embodiments of the invention, the height (h1) of the via 620 is 1.25 to 2 times the CD1 or CD2. In one or more embodiments of the invention, the CD2 of the top portion of the via 620 is smaller than the CD of the line layer. For example, the CD of the line portion of the top electrodes 606A, 606B, 606C is 18 nm. A CMP can be performed to planarize the structure 300.

Figure 7:
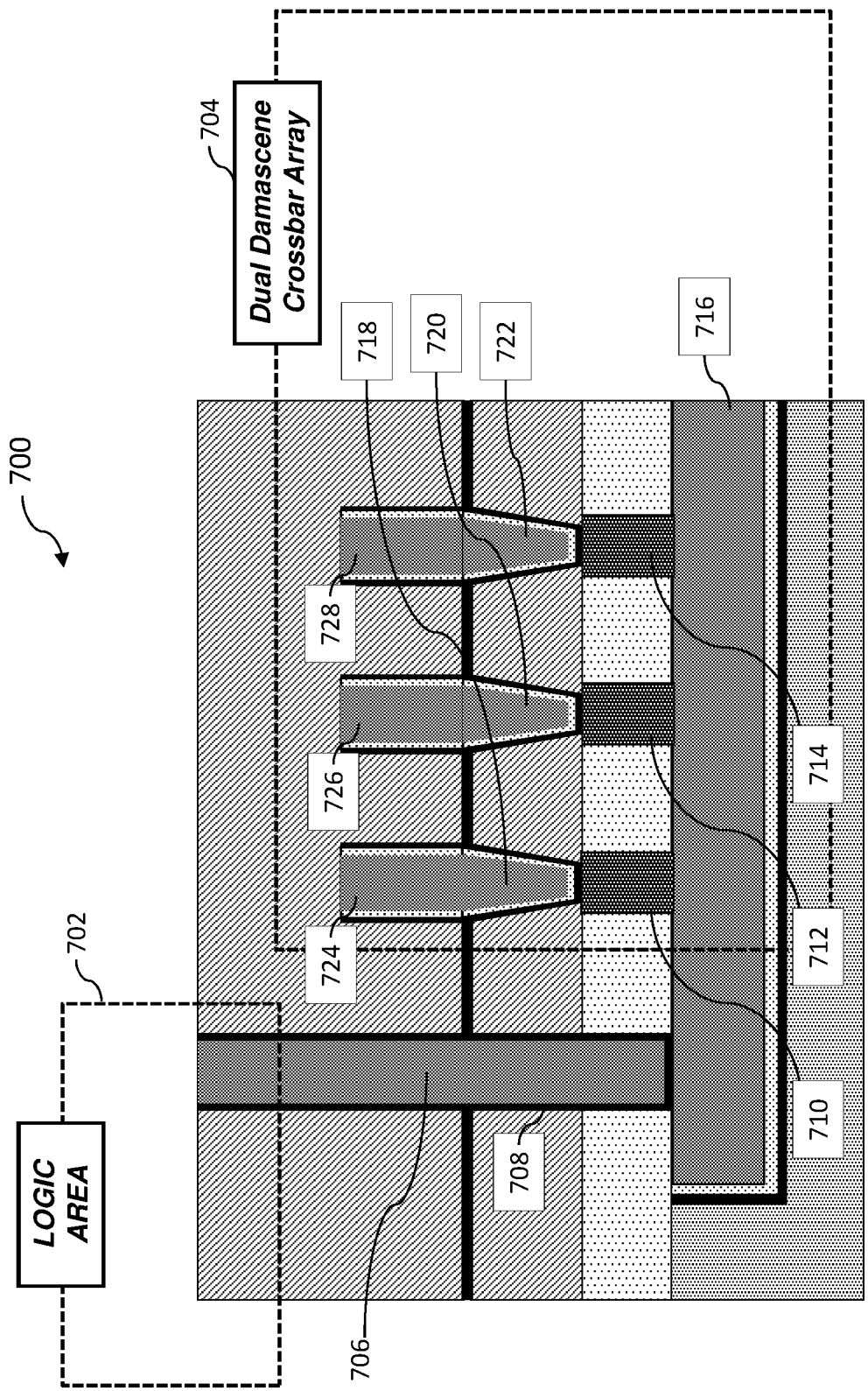
FIG. 7 depicts an example system coupled to the crossbar array in accordance with embodiments of the invention.

FIG. 7 depicts a system 700 incorporating the crossbar array 704. As shown, the logic area 702 is coupled to the crossbar array 704 through an interconnection 706. The interconnection 706 may be a copper interconnection, and in one or more embodiments of the invention, the interconnection 706 may reside in a barrier layer 708. In this non-limiting example, the system 700 includes three (3) memory devices 710, 712, 714. Each of the memory devices 710, 712, 714 is formed on a bottom electrode 716. Also, each of the memory devices 710, 712, 714 is coupled to a respective via 718, 720, 722. Each of the vias is coupled to respective top electrode layers 724, 726, 728.

Figure 8:
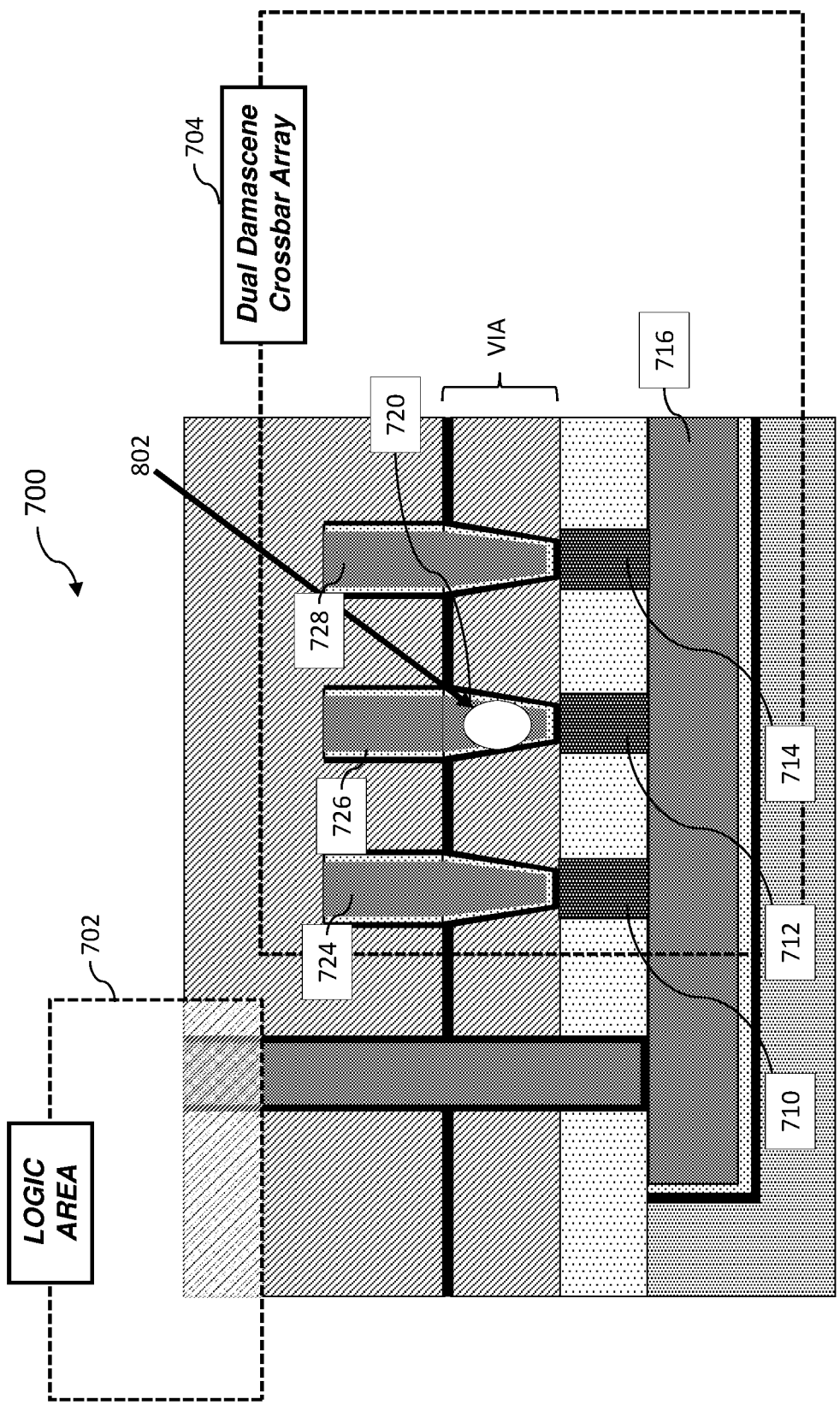
FIG. 8 depicts a first view of a system in accordance with embodiments of the invention.

FIG. 8 depicts a first view of the system 700 after a void is formed in the via corresponding to the faulty memory device 712. In the perspective view shown in FIG. 8, the memory devices 710, 712, 714 are formed on the common bottom electrode 716. In one or more embodiments of the invention, the memory device 712 may be determined to be faulty or defective using various testing techniques. Once the device is identified and determined to be faulty, the device can be disabled by providing a current through the device, at the location in the array, to induce a void by electromigration. A void 802 is formed in the via of the memory device 712 by passing a high current through the memory device 712. Due to the effects of electromigration and the dimensions of the via, the void 802 disables the memory device 712.

Figure 9:
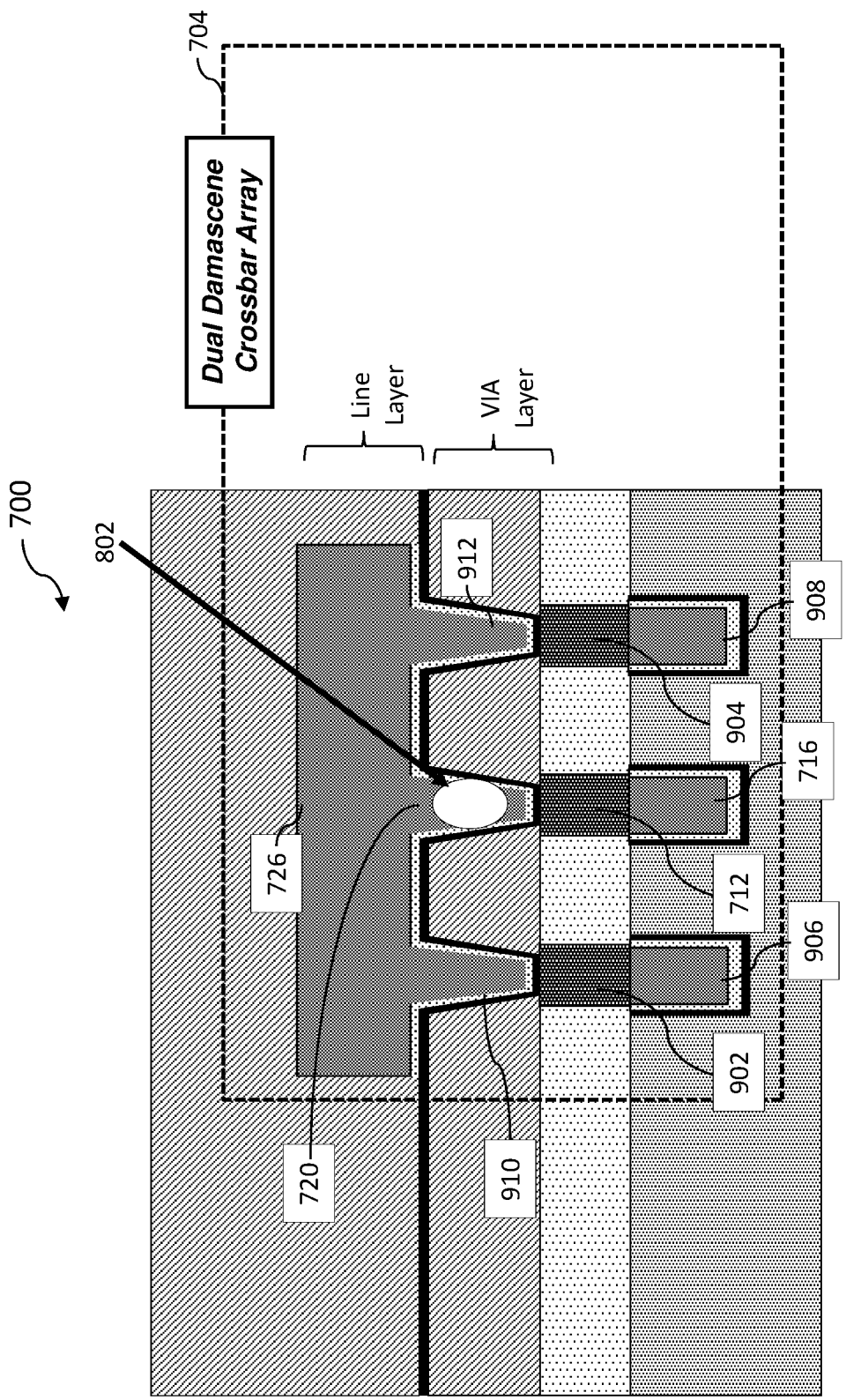
FIG. 9 depicts an alternate view of the system in accordance with one or more embodiments of the invention.

FIG. 9 depicts an alternative view of the system 700. As shown the line portion of the top electrode layer 726 is coupled to the memory devices 902, 712, 904. The memory device 712 is formed on the bottom electrode 716 (shown in FIG. 8). The memory devices 902, 904 are formed on adjacent bottom electrode layers 906, 908, respectively. Also, FIG. 9 depicts vias 910, 720, 912 that correspond to the memory devices 902, 712, 904, respectively. The void 802 has been induced in the via 720 to disable the faulty memory device 712.

Figure 10:
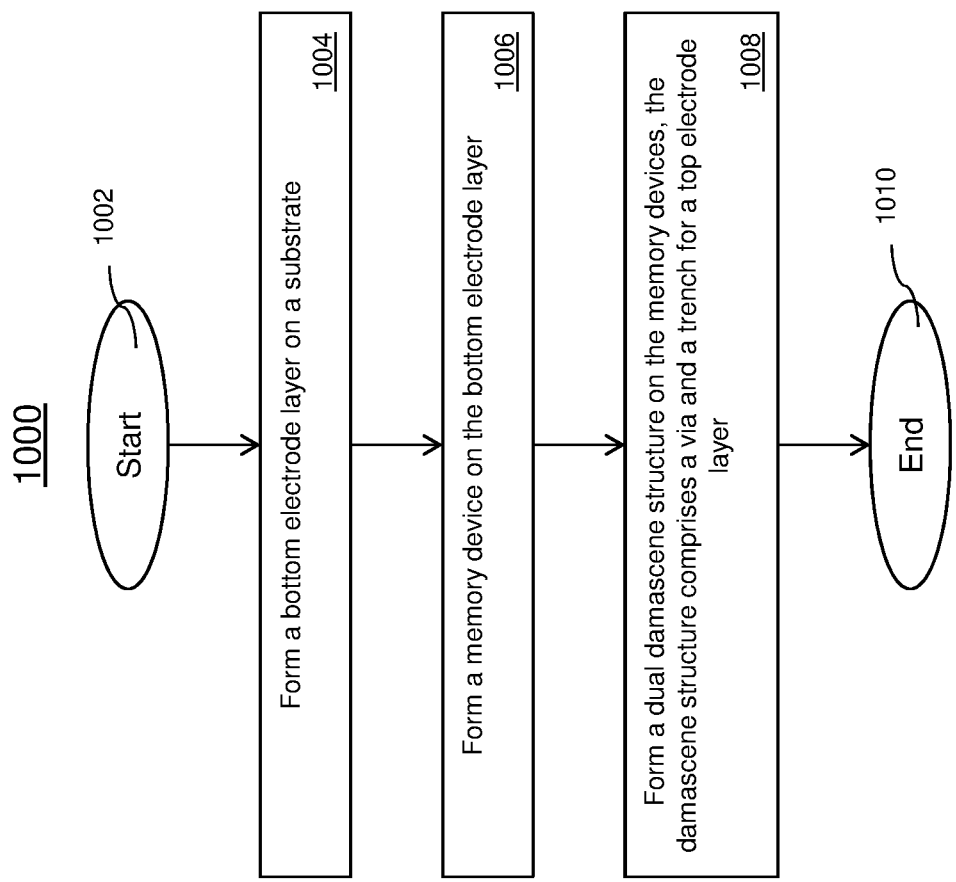
FIG. 10 depicts a flow diagram illustrating a method according to one or more embodiments of the invention.

FIG. 10 depicts a flowchart of a method 1000 for forming a dual damascene crossbar array in accordance with one or more embodiments. The method 1000 begins at block 1002 and proceeds to block 1004 which forms a bottom electrode layer on a substrate. The bottom electrode layer provides contacts for the memory devices. Block 1006 forms a memory device on the bottom electrode layer. The memory device is a RRAM. Block 1008 forms a dual damascene structure on the memory device, the dual damascene structure comprises a top electrode layer and a via, where the via is formed between the memory device and the top electrode layer. In one or more embodiments of the invention, the via is a tapered via where a top portion of the via is coupled to a line portion of the top electrode layer and a bottom portion of the via is coupled to the memory device. The critical dimension of the line portion of the top electrode layer is larger than the critical dimensions of the via. This ensures that if a void is induced, the void is formed in the via and not in the top electrode layer so that the remaining devices in the row/column remain operational. The method 1000 ends at block 1010. It should be understood the method 1000 is not intended to limit the scope and different steps, or additional steps can be incorporated into the method 1000.

One or more aspects of the invention improve over the prior art by providing the ability to disable individual memory devices of the crossbar array structure while maintaining the operability of the remaining devices of the crossbar array.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a dual damascene crossbar array, the method comprising:
    forming a bottom electrode layer on a substrate;
    forming a first memory device on the bottom electrode layer;
    forming a dual damascene structure on the first memory device, wherein the dual damascene structure comprises a top electrode layer and a first via, wherein the first via is formed between the first memory device and the top electrode layer;
    forming a second memory device on the bottom electrode layer; and
    forming a second via for the second memory device;
    wherein the second via is formed between the second memory device and the top electrode layer.

2. The method of claim 1, wherein the via is a tapered via.

3. The method of claim 2, wherein the via includes a top portion coupled to the top electrode having a first critical dimension (CD) and a bottom portion coupled to the first memory device having a second CD.

4. The method of claim 3, wherein the first CD is larger than the second CD.

5. The method of claim 4, wherein a CD of a line of the top electrode layer is larger than the second CD of the via.

6. A dual damascene crossbar array comprising:
    one or more memory devices of the dual damascene crossbar array;
    a bottom electrode coupled to the one or more memory devices;
    one or more vias coupled to each memory device; and
    a top electrode layer coupled to the one or more vias, the one or more vias are positioned between the memory device and the top electrode layer;
    wherein each of the one or more vias are tapered; and
    wherein each of the one or more vias include a top portion coupled to the top electrode layer having a first critical dimension (CD).

7. The crossbar array of claim 6, wherein each of the one or more vias further includes a bottom portion coupled to the memory device having a second CD.

8. The crossbar array of claim 7, wherein each of the one or more vias has a CD that is in a range of 12-14 nm.

9. The crossbar array of claim 7, wherein the first CD is larger than the second CD.

10. The crossbar array of claim 9, wherein a CD of a line portion of the top electrode layer is larger than the second CD of the via.

11. The crossbar array of claim 10, wherein the line portion of the top electrode layer has a CD of 18 nm.

12. The crossbar array of claim 10, wherein a height of each of the one or more vias is 1.25 to 2 times at least one of the first CD or the second CD of the via.

13. The crossbar array of claim 6, wherein the bottom electrode is comprised of at least one of tungsten (W), molybdenum (Mo), ruthenium (Ru), and cobalt (Co).

14. A dual damascene crossbar array comprising:
    one or more memory devices of the dual damascene crossbar array;
    a bottom electrode coupled to the one or more memory devices;
    one or more vias coupled to each memory device;
    a top electrode layer coupled to the one or more vias, the one or more vias are positioned between the memory device and the top electrode layer; and
    a logic area coupled to the crossbar array through an interconnect, wherein the interconnect is configured to pass an increased current through the one or more memory devices to induce a void in the one or more vias.

* * * * *